United States Patent [19]
Seelbach et al.

[11] Patent Number: 5,120,998
[45] Date of Patent: Jun. 9, 1992

[54] SOURCE TERMINATED TRANSMISSION LINE DRIVER

[75] Inventors: Walter C. Seelbach, Fountain Hills; Douglas W. Schucker, Mesa, both of Ariz.

[73] Assignee: Motorola, Inc., Schaumburg, Ill.

[21] Appl. No.: 664,896

[22] Filed: Mar. 4, 1991

[51] Int. Cl.$^5$ ...................... H03K 17/16; H03K 17/60
[52] U.S. Cl. ................................... 307/443; 307/246; 307/247.1
[58] Field of Search ............... 307/443, 454, 455, 475, 307/246, 247.1, 253, 254, 264, 268, 270, 600

[56] References Cited

U.S. PATENT DOCUMENTS

| | | | |
|---|---|---|---|
| 4,570,240 | 2/1986 | Seelbach et al. | 365/204 |
| 4,605,870 | 8/1986 | Dansky et al. | 307/280 X |
| 4,668,879 | 5/1987 | Dansky et al. | 307/291 X |
| 4,680,480 | 7/1987 | Hopta | 307/247.1 X |
| 4,835,420 | 5/1989 | Rosky | 307/246 X |
| 4,874,970 | 10/1989 | Coy et al. | 307/246 X |

*Primary Examiner*—David Mis
*Attorney, Agent, or Firm*—Bradley J. Botsch

[57] ABSTRACT

A source terminated transmission line driver circuit having an output coupled to a transmission line through a resistor is provided. The driver circuit has a gate circuit for providing first and second signals and a pulse generator circuit responsive to the second signal of the gate circuit for providing a pulse current at an output when the second signal is switching from a first logic state to a second logic state and for otherwise providing a quiescent current at the output. The driver circuit also has a first circuit responsive to the first output signal of the gate circuit for sourcing current to the output of the source terminated transmission line driver circuit, the first circuit being responsive to the second output signal of the gate circuit for sinking an adjustable current at the output of the source terminated transmission line driver circuit. The first circuit has a first transistor having a collector, a base and an emitter, the emitter being coupled to the output of the source terminated transmission line driver circuit, the base being coupled to receive the first signal of the gate circuit, and the collector being coupled to the first supply voltage terminal, a second transistor having a collector, a base and an emitter, the emitter of the second transistor being coupled to the output of the source terminated transmission line driver circuit, the base of the second transistor being coupled to the output of the pulse generator circuit, the collector being coupled to a second supply voltage terminal, a third transistor having a collector, a base and an emitter, the collector of the third transistor being coupled to the first supply voltage terminal, the base of the third transistor being coupled to the base of the first transistor, and a fourth transistor having a collector, a base and an emitter, the collector and base of the fourth transistor being coupled to the emitter of the third transistor, the emitter of the fourth transistor being coupled to the base of the second transistor.

7 Claims, 2 Drawing Sheets

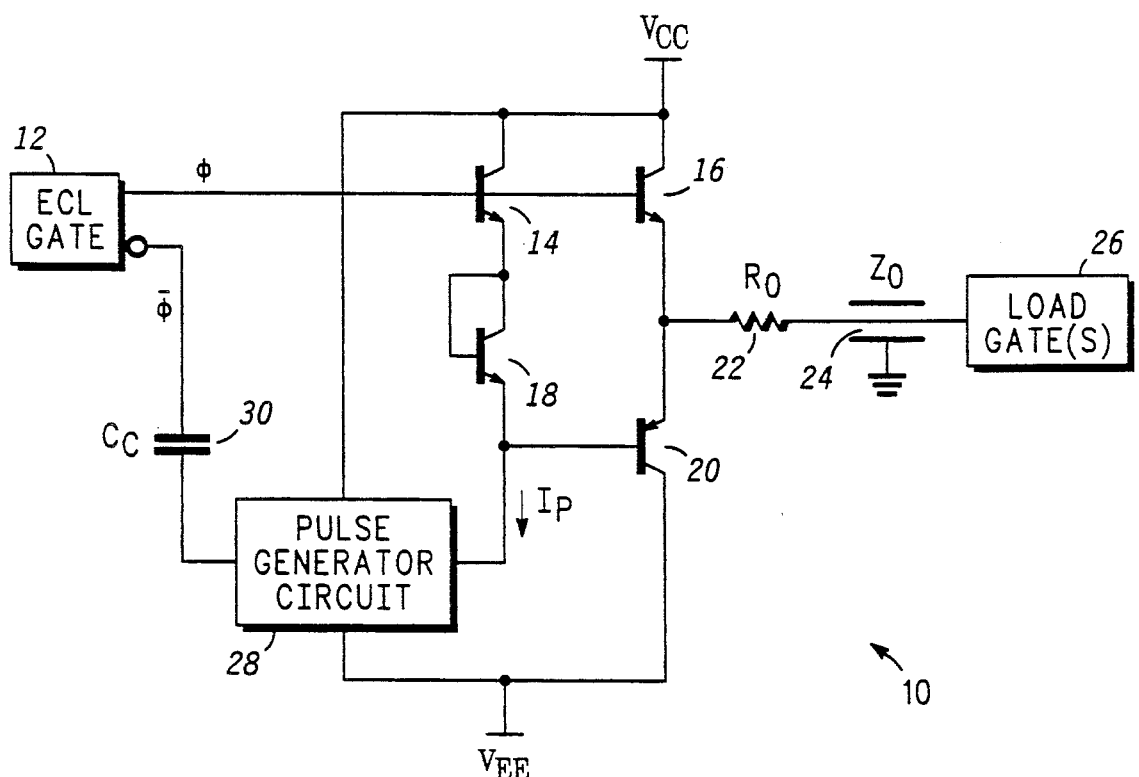
FIG. 1
FIG. 2
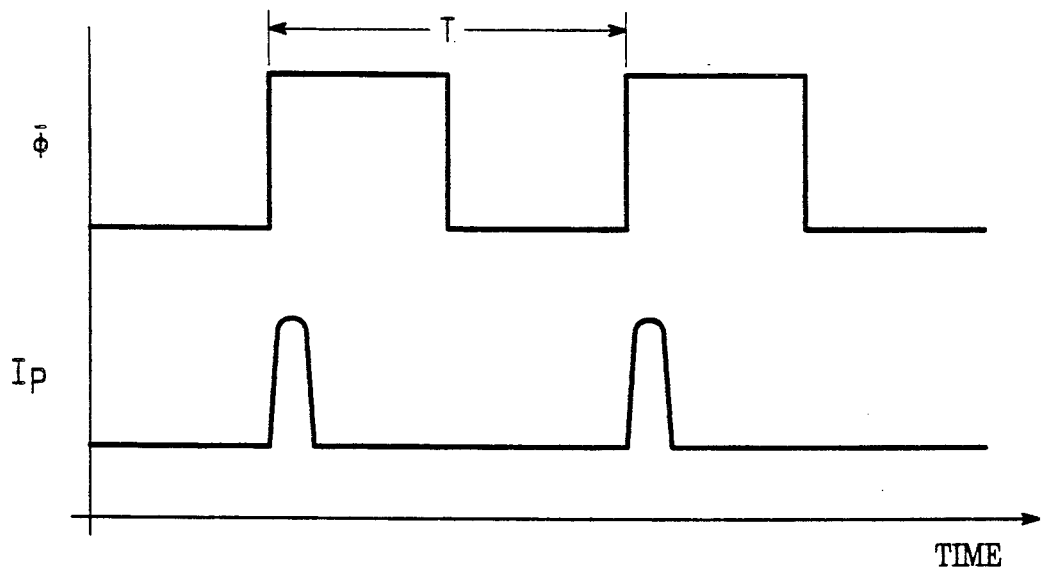

SOURCE TERMINATED TRANSMISSION LINE DRIVER

BACKGROUND OF THE INVENTION

This invention relates to drivers, for example, an ECL source terminated transmission line driver.

An ECL transmission line driver charges up a voltage on a transmission line in response to a logic high voltage level appearing at an output of an ECL gate. Further, in response to logic low voltage level appearing at the output of the ECL gate, the ECL transmission line driver discharges the voltage on the transmission line to a logic low voltage level. It is well known that ECL drivers typically have good high frequency performance. However, ECL drivers dissipate high power in a steady state condition as well as when switching from one logic state to another.

One example of an ECL transmission line driver includes a first transistor having a base coupled to the output of an ECL gate. The emitter of the first transistor is coupled to a transmission line through a source terminated resistor. A second transistor, having a base coupled to a reference voltage and a collector coupled to the emitter of the first transistor, sinks a predetermined current at its collector. Briefly, when the output of the ECL gate switches to a logic high state, the first transistor is rendered operative thereby causing a positive voltage transition at the emitter of the first transistor and on the transmission line. Further, the predetermined current sunk by the second transistor is sourced from the emitter of the first transistor. On the other hand, when the output of the ECL gate switches to a logic low state, the first transistor is rendered non-operative while the second transistor sinks the predetermined current from the transmission line to cause a negative voltage transition on the transmission line. Thus, it must be realized that the second transistor always sinks the predetermined current regardless of the voltage level appearing at the output of the ECL gate. As a result, the above described source terminated transmission line driver is not power efficient since the second transistor must always sink a predetermined current wherein this predetermined current must be large enough to cause a negative voltage transition on the transmission line even when the output of the ECL gate is at a logic high voltage level.

Hence, a need exists for a source terminated transmission line driver circuit that adequately charges and discharges a transmission line to respective high and low voltage levels while minimizing power dissipation.

SUMMARY OF THE INVENTION

Briefly, there is provided a source terminated transmission line driver circuit having an output coupled to a transmission line through a resistor, comprising: a gate circuit for providing first and second signals; a pulse generator circuit responsive to the second signal of the gate circuit for providing a pulse current at an output when the second signal is switching from a first logic state to a second logic state and for otherwise providing a quiescent current at the output; and a first circuit responsive to the first output signal of the gate circuit for sourcing current to the output of the source terminated transmission line driver circuit, the first circuit being responsive to the second output signal of the gate circuit for sinking an adjustable current at the output of the source terminated transmission line driver circuit, the first circuit including
a first transistor having a collector, a base and an emitter, the emitter being coupled to the output of the source terminated transmission line driver circuit, the base being coupled to receive the first signal of the gate circuit, and the collector being coupled to the first supply voltage terminal, a second transistor having a collector, a base and an emitter, the emitter of the second transistor being coupled to the output of the source terminated transmission line driver circuit, the base of the second transistor being coupled to the output of the pulse generator circuit, the collector being coupled to a second supply voltage terminal, a third transistor having a collector, a base and an emitter, the collector of the third transistor being coupled to the first supply voltage terminal, the base of the third transistor being coupled to the base of the first transistor, and a fourth transistor having a collector, a base and an emitter, the collector and base of the fourth transistor being coupled to the emitter of the third transistor, the emitter of the fourth transistor being coupled to the base of the second transistor.

It is an advantage of the present invention to provide a transmission line driver which provides a first current to discharge a transmission line from a logic high level to a logic low level and provides a second current to maintain the logic low level on the transmission line wherein the magnitude of the first current is substantially larger that the magnitude of the second current. It is also and advantage of the present invention to provide a pulse generator circuit having an output for providing an adjustable current thereto in response to an input signal applied at an input.

The above advantages and features of the present invention will be better understood when taken in conjunction with the accompanying drawings.

BRIEF DESCRIPTION OF THE DRAWINGS

FIG. 1 is a partial schematic diagram illustrating a source terminated transmission line driver in accordance with the present invention;

FIG. 2 is a pictorial diagram illustrating typical waveforms occurring within the source terminated transmission line driver.

DETAILED DESCRIPTION OF THE INVENTION

Figure 3:
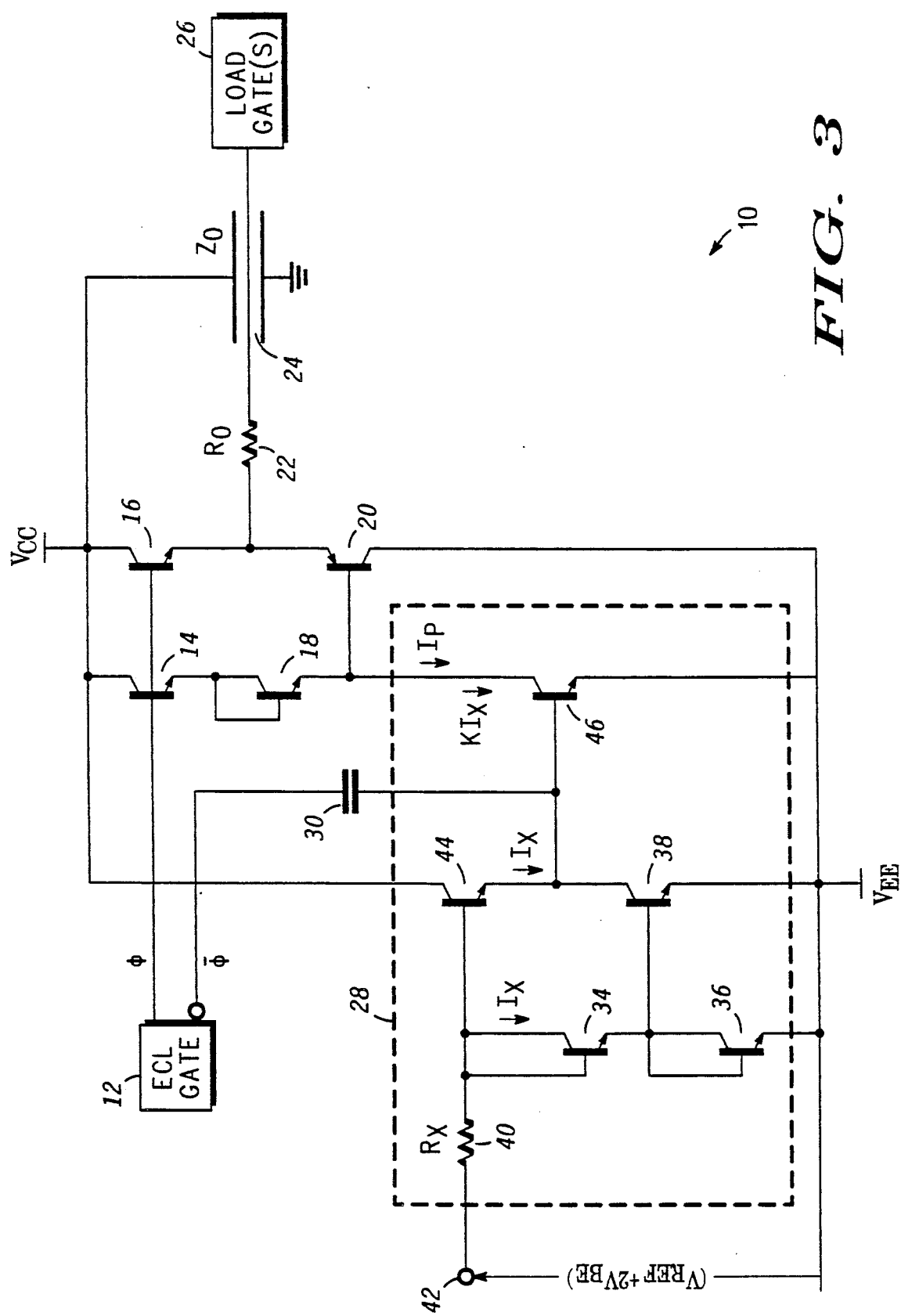
FIG. 3 is a partial schematic diagram illustrating a pulse generator circuit in a source terminated transmission line driver in accordance with the present invention.

Referring to FIG. 1, a partial schematic diagram is shown which illustrates source terminated transmission line driver 10 being responsive to complementary output logic signals appearing at first and second outputs of ECL gate 12. Transmission line driver 10 comprises transistors 14 and 16 which have their bases coupled to the first output of ECL gate 12. The collectors of NPN transistors 14 and 16 are coupled to a first supply voltage terminal at which the operating potential $V_{CC}$ is applied. The emitter of NPN transistor 14 is coupled to the base and collector of diode connected NPN transistor 18 wherein the emitter of NPN transistor 18 is coupled to the base of PNP transistor 20. The common emitters of transistors 16 and 20 are coupled to a first terminal of series termination resistor 22 whereby the second terminal of resistor 22 is coupled to a first terminal of transmission line 24 which has a characteristic impedance of $Z_O$. It is understood that for best matching, the value of resistor 22 is substantially equal to characteristic impedance $Z_O$. Further, the second terminal of coax line 24 is coupled to load gates 26 which typically exhibit a high input impedance relative to characteristic impedance $Z_O$. The collector of transistor 20 is coupled to a second supply voltage terminal at which the operating potential $V_{EE}$ is applied. Pulse generator circuit 28, coupled between operating potentials $V_{CC}$ and $V_{EE}$, has an input coupled through coupling capacitor 30 to the second output of ECL gate 12. The output of pulse generator circuit 28 is coupled to the base of transistor 20.

Briefly, in operation, when the first output of ECL gate 12 switches to a logic low level, transistor 16 is rendered non-operative and no longer sources current to transmission line 24. Correspondingly, the second output of ECL gate 12 switches from a logic low to a logic high voltage level thereby generating a current pulse via coupling capacitor 30 which is supplied at the input of pulse generator circuit 28. In response to the current pulse, the output of pulse generator circuit 28 provides current pulse $I_P$ which functions to rapidly discharge the voltage at the base of transistor 20 thereby providing the proper voltage at the base of transistor 20 to allow transistor 20 to adequately discharge line 24 from a logic high voltage level to a logic low voltage level. The timing relationship between the logic signal occurring at the second output of ECL gate 12, denoted by $\phi$, and current $I_P$ is illustrated in FIG. 2 where T denotes the period of the signal occurring at the second output of ECL gate 12. As can be seen from FIG. 2, current pulse $I_P$ is provided when the logic signal at the second output of ECL gate 12 transitions from a logic low to logic high voltage level. Further, it must be realized that current pulse $I_P$ is only provided for a short duration of time so as to allow transistor 20 to sufficiently pull down the voltage at its emitter to cause a transition from a logic high voltage level to a logic low voltage level. Or equivalently, pulse generator circuit 28 provides current pulse $I_P$ only when transistor 20 is required to discharge transmission line 24 from a logic high voltage level to a logic low voltage level. Therefore, since current pulse $I_P$ is only provided for a short duration of time, a substantial savings in power dissipation is achieved. It should be realized by one of ordinary skill in the art that the current pulse generated at the input of pulse generator circuit 28 is a function the value of coupling capacitor 30 and of the rise time and voltage level swing of the logic signal occurring at the second output of ECL gate 12.

On the other hand, when the first output of ECL gate 12 is at a logic high state, transistor 16 is rendered operative and supplies current to transmission line 24 to charge the voltage at the emitter of transistor 16 to a logic high voltage level, as is understood. In addition, transistors 14 and 18 are biased by pulse generator circuit 28 to provide a predetermined voltage at the bases of transistors 18 and 20 to bias transistors 18 and 20 at a low quiescent current.

Referring to FIG. 3, a partial schematic diagram illustrating pulse generator circuit 28 of source terminated transmission line driver 10 is shown. It is understood that components similar to those shown in FIG. 1 are designated by like reference numerals. Pulse generator circuit 28 includes diode connected transistors 34 and 36 whereby the emitter of transistor 36 is coupled to operating potential $V_{EE}$. The emitter of transistor 34 is coupled to the base and collector of transistor 36 and to the base of transistor 38. The base and collector of transistor 34 is coupled to a first terminal of resistor 40, the latter having a second terminal coupled to terminal 42. Voltage ($V_{REF}+2\ V_{BE}$) is applied between terminal 42 and operating potential $V_{EE}$. The collector of transistor 38 is coupled to the emitter of transistor 44 and to the base of transistor 46. The base of transistor 44 is coupled to the base of transistor 34 while the collector of transistor 44 is coupled to operating potential $V_{CC}$. The base of transistor 46 is coupled to the second terminal of coupling capacitor 30. The emitters of transistors 38 and 46 are coupled to operating potential $V_{EE}$. The collector of transistor 46 which provides the output of pulse generator circuit 28 is coupled to the base of transistor 20. It is worth noting that the emitter area of transistors 34, 36, 38 and 46 are substantially equal and denoted by $A_{E0}$ while the emitter area of transistor 44 is ($K \times A_{E0}$) wherein K is typically greater than or equal to one and area $A_{E0}$ represents a minimum geometry device.

The present invention provides a first current, denoted by $I_P$, and a second current, denoted by $KI_X$, both appearing at the collector of transistor 46 wherein the magnitude of the first current is substantially larger than the magnitude of the second current. The first current is provided such that the voltage level at the emitter of transistor 20 is adequately discharged from a logic high voltage level to a logic low voltage level. The lower value second current is provided at all other times thereby resulting in a substantial power savings.

In operation, voltage potential ($V_{REF}+2\ V_{BE}$) is applied between terminal 42 and operating potential $V_{EE}$ whereby voltage $V_{REF}$ may be generated from a bandgap circuit thereby making voltage $V_{REF}$ substantially independent of temperature and power supply. Since the voltages across each diode connected transistor 34 and 36 is substantially equal to voltage $V_{BE}$, current $I_X$ flowing through resistor 40 and transistors 34 and 36 can be calculated as:

$$I_X = V_{REF}/R_X \qquad (1)$$

where $R_X$ is the value of resistor 40 and current $I_X$ is also substantially independent of temperature and power supply.

Constant current $I_X$, which can be designed to be 30 microamps in order to conserve power, is mirrored through transistors 34 and 36 to transistors 44 and 38, respectively. This provides a predetermined voltage at the base of transistor 46 which, via simple transistor theory, causes constant current $KI_X$ to flow at the collector of transistor 46. Current $KI_X$ also flows through transistors 14 and 18 which provides bias voltages at the bases of transistors 16 and 20. Further, current $KI_X$ also flows through transistors 16 and 20 via current $KI_X$ being mirrored by transistor 14 and transistor 18. It is worth noting that designing the emitter area of transistor 44 to be ($K \times A_{E0}$) allows adjustment (via adjustment of K) of the collector current of transistor 46 without affecting the power dissipation of pulse generator circuit 28.

When the first output of ECL gate 12 switches from a logic high to a logic low voltage level, the voltage level at the bases of transistors 14 and 16 are lowered and transistor 16 no longer sources current to transmission line 24. Correspondingly, the complimentary second output of ECL gate 12 switches from a logic low to a logic high voltage level. This creates a current pulse to flow through capacitor 30 to charge capacitor 30. As a result, this current pulse flows out of the second output of ECL gate 12 and flows into the base of transistor 46. It is understood that the magnitude and duration of this current pulse is a function of the rise time and voltage swing of the logic signal occurring at the second output of ECL gate 12 and of the value of capacitor 30, as related by the well known equation of $I = C \times dV/dt$. This current pulse substantially increases the small quiescent current ($KI_X$) at the collector of transistor 46 to a larger discharge current ($I_P$) whereby the increased discharge current is pulled from the base of transistor 20 to rapidly discharge the parasitic device capacitance thereat. Current $I_P$ also allows the voltage at the emitter of transistor 18 to rapidly follow the voltage at the base of transistor 20 such that the voltage at the base of transistor 20 is clamped to a predetermined voltage. This predetermined voltage clamped at the base of transistor 20 allows transistor 20 to sink a substantial increase of current such that the voltage at the emitter of transistor 20 may be discharged from the existing logic high voltage level to a logic low voltage level. It is very important to realized that once the logic transition at the emitter of transistor 20 has occurred, the increased discharge current through transistor 46 is not necessary. Therefore, the current pulse may be returned to zero and the current at the collector of transistor 46 may be returned to quiescent current $KI_X$ thereby resulting in a substantial savings in power. It should also be realized that transistors 14, 16 and 18 properly maintain transistor 20 biased so that any reflections that may return to the emitter of transistor 20 via transmission line 24 will be sunk by transistor 20. It is worth noting that PNP transistor 20 and NPN transistor 18 are matched by design such that $V_{BE(18)} = V_{BE(20)}$. Further, it is worth noting that NPN transistor 18 could be a PNP transistor if the PNP transistor had an isolated collector.

On the other hand, when the first output of ECL gate 12 switches from a logic low state to a logic high state, a high voltage level is applied to the bases of transistors 14 and 16 and transistor 16 supplies current to transmission line 24 to charge the voltage at the emitter of transistor 16 to a logic high voltage level. Transistors 14 and 16 are matched and have emitter areas, denoted by $A_{E1}$, the emitter areas must be designed large enough to handle the current required to source to and to sink from transmission line 24 to respectively cause a positive and negative voltage transition thereat. Simultaneously, the second output of ECL gate 12 switches from a logic high state to a logic low state thereby creating a pulse current to flow through capacitor 30. As a result, this pulse current flows out from the emitter of transistor 44 and into the second output of ECL gate 12 thereby discharging capacitor 30. Further, constant current $KI_X$ flows at the collector of transistor 46. It should be understood that discharging capacitor 30 as aforedescribed provides a way of achieving maximum frequency of operation as well as maintaining a 50% duty cycle for the output signals of ECL gate 12 whereby the frequency of operation is related to the second output of ECL gate of FIG. 2 by $F = 1/T$, as is understood. Further, it should be understood that it is desired to discharge capacitor 30 at substantially the same rate as capacitor 30 was charged since the maximum frequency of operation is determined by the total time to discharge and charge capacitor 30. In addition, if capacitor 30 discharged at a rate substantially slower than the rate at which it was charged, a non-symmetrical duty cycle for the output signals of ECL gate 12 would typically be required.

In summary, the present invention recognizes that large currents are only necessary when discharging the voltage at the emitter of transistor 20 from a logic high to a logic low voltage level. Further, once a logic low voltage level is achieved, a substantially reduced current may be utilized to maintain proper voltage biasing at the base of transistor 20 so that any voltage reflections from transmission line 24 can be absorbed. Therefore, pulse generator circuit 28 provides a first current when discharging the voltage at the emitter of transistor 20 and provides a second current to maintain the biasing of transistor 20 at all other times wherein the second current has a magnitude that is substantially reduced from the magnitude of the first current.

By now it should be apparent from the foregoing discussion that a novel ECL source terminated transmission line driver has been provided that generates a current pulse in response to a logic transition occurring at an output of an ECL gate thereby allowing a logic high to logic low voltage level transition to occur at an output of the ECL driver circuit. It should also be apparent from the foregoing that a novel pulse generator circuit has been provided which is responsive to an input signal for providing an adjustable current at an output.

We claim:

1. A source terminated transmission line driver circuit having an output coupled to a transmission line through a resistor, comprising:

a gate circuit for providing first and second signals;

a pulse generator circuit responsive to said second signal of said gate circuit for providing a pulse current at an output when said second signal is switching from a first logic state to a second logic state and for providing a quiescent current at said output otherwise; and circuit means responsive to said first output signal of said gate circuit for sourcing current to the output of the source terminated transmission line driver circuit, said circuit means being responsive to said second output signal of said gate circuit for sinking an adjustable current at the output of the source terminated transmission line driver circuit, said circuit means including a first transistor having a collector, a base and an emitter, said emitter being coupled to the output of the source terminated transmission line driver circuit, said base being coupled to receive said first signal of said gate circuit, and said collector being coupled to a first supply voltage terminal;

a second transistor having a collector, a base and an emitter, said emitter of said second transistor being coupled to the output of the source terminated transmission line driver circuit, said base of said second transistor being coupled to said output of said pulse generator circuit, said collector being coupled to a second supply voltage terminal;

a third transistor having a collector, a base and an emitter, said collector of said third transistor being coupled to said first supply voltage terminal, said base of said third transistor being coupled to said base of said first transistor; and a fourth transistor having a collector, a base and an emitter, said collector and base of said fourth transistor being coupled to said emitter of said third transistor, said emitter of said fourth transistor being coupled to said base of said second transistor.

2. A source terminated transmission line driver according to claim 1 wherein the magnitude of said pulse current is substantially larger than the magnitude of said quiescent current.

3. The source terminated transmission line driver according to claim 1 further including a capacitor having first and second terminals, said first terminal of said capacitor being coupled to receive said second signal of said gate circuit, said second terminal of said capacitor being coupled to said pulse generator circuit wherein the magnitude and duration of said pulse current is a function of a transition time and a voltage swing of said second signal of said gate circuit and the value of said capacitor.

4. The source terminated transmission line driver according to claim 1 wherein said pulse generator circuit includes:
- a first transistor having a collector, a base and an emitter;
- a second transistor having a collector, a base and an emitter, said base and said collector of said second transistor being coupled to said emitter of said first transistor, said emitter of said second transistor being coupled to a first supply voltage terminal;
- a third transistor having a collector, a base and an emitter, said collector of said third transistor being coupled to a second supply voltage terminal, said base of said third transistor being coupled to both said base and said collector of said first transistor;
- a fourth transistor having a collector, a base and an emitter, said collector of said fourth transistor being coupled to said emitter of said third transistor, said base of said fourth transistor being coupled to said collector of said second transistor, and said emitter of said fourth transistor being coupled to said first supply voltage terminal;
- a fifth transistor having a collector, a base and an emitter, said collector of said fifth transistor being coupled to said output of said pulse generator circuit, said base of said fifth transistor being coupled to said collector of said fourth transistor, and said emitter of said fifth transistor being coupled to said first supply voltage terminal; and
- a resistor having first and second terminals, said first terminal of said resistor being coupled to said collector of said first transistor, and said second terminal of said resistor being coupled to receive a reference voltage which is referenced with respect to said first supply voltage terminal.

5. The source terminated transmission line driver circuit according to claim 1 wherein said first and third transistors of said circuit means are matched.

6. The source terminated transmission line driver circuit according to claim 5 wherein said second and fourth transistors of said circuit means are matched.

7. A pulse generator circuit responsive to an input signal and having an output, comprising:
- a first transistor having a collector, a base and an emitter;
- a second transistor having a collector, a base and an emitter, said base and said collector of said second transistor being coupled to said emitter of said first transistor, said emitter of said second transistor being coupled to a first supply voltage terminal;
- a third transistor having a collector, a base and an emitter, said collector of said third transistor being coupled to a second supply voltage terminal, said base of said third transistor being coupled to both said base and said collector of said first transistor;
- a fourth transistor having a collector, a base and an emitter, said collector of said fourth transistor being coupled to said emitter of said third transistor, said base of said fourth transistor being coupled to said collector of said second transistor, and said emitter of said fourth transistor being coupled to said first supply voltage terminal;
- a fifth transistor having a collector, a base and an emitter, said collector of said fifth transistor being coupled to said output of the pulse generator circuit, said base of said fifth transistor being coupled to said collector of said fourth transistor, and said emitter of said fifth transistor being coupled to said first supply voltage terminal;
- a capacitor having first and second terminals, said first terminal of said capacitor being coupled to receive the input signal, and said second terminal of said capacitor being coupled to said base of said fifth transistor; and
- a resistor having first and second terminals, said first terminal of said resistor being coupled to said collector of said first transistor, and said second terminal of said resistor being coupled to receive a reference voltage which is referenced with respect to said first supply voltage terminal.

* * * * *